Figure 1:
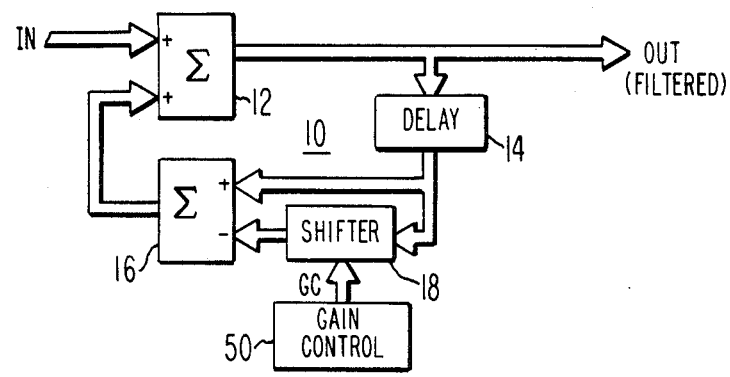

United States Patent [19]

Dieterich

[11] Patent Number: 4,573,135
[45] Date of Patent: Feb. 25, 1986

[54] DIGITAL LOWPASS FILTER HAVING CONTROLLABLE GAIN

[75] Inventor: Charles B. Dieterich, Princeton, N.J.

[73] Assignee: RCA Corporation, Princeton, N.J.

[21] Appl. No.: 488,594

[22] Filed: Apr. 25, 1983

[51] Int. Cl.⁴ .............................................. G06F 7/38
[52] U.S. Cl. .................................................. 364/724
[58] Field of Search ........ 364/724, 825, 200 MS File, 364/900 MS File; 333/165–167, 171, 174

[56] References Cited

U.S. PATENT DOCUMENTS

| | | | |
|---|---|---|---|
| 3,757,261 | 9/1973 | Sather | 364/724 |
| 4,099,229 | 7/1978 | Kancler | 364/200 |
| 4,236,224 | 11/1980 | Chang | 364/724 |
| 4,288,857 | 9/1981 | Wilterding et al. | 364/724 |
| 4,302,817 | 11/1981 | Labedz | 364/724 |
| 4,337,518 | 6/1982 | Ohnishi et al. | 364/724 |
| 4,388,729 | 6/1983 | Spencer et al. | 455/72 |

FOREIGN PATENT DOCUMENTS 2022954 12/1979 United Kingdom .

OTHER PUBLICATIONS

D. DeMaw et al., Ed., *The Radio Amateur's Handbook*, 56th Edition, American Radio Relay League, 1979, pp. 13-8 to 13-9.
B. Gold et al., *Digital Processing of Signals*, McGraw-Hill Book Co., 1969, Chapter 2, pp. 19–25, 36–43.
R. Karwoski, "Introduction to the Z Transform and its Derivation", TRW LSI Products, Sep. 1979, pp. 1–22.
L. Jackson, et al., "An Approach to the Implementation of Digital Filters", *IEEE Trans. on Audio Electroacoustics*, vol. AU-16, Sep. 1968, pp. 413–421 (Reprint pp. 210–218).

Primary Examiner—James D. Thomas
Assistant Examiner—Dale M. Shaw
Attorney, Agent, or Firm—Eugene M. Whitacre; Paul J. Rasmussen; Clement A. Berard, Jr.

[57] ABSTRACT

A digital lowpass filter having controllable gain produces a filtered digital signal by adding to the digital input signal a feedback signal produced from the filtered digital signal. The feedback signal is produced by a delay element and by a gain element including a controllable shifter. The effective gain exhibited by the digital filter can be made to have values between the discrete values produced by the shifter by changing the shifter gain as a function of time.

15 Claims, 3 Drawing Figures

DIGITAL LOWPASS FILTER HAVING CONTROLLABLE GAIN

The present invention relates to digital lowpass filters having a controllable gain.

Digital lowpass filters having fixed gains are disclosed, for example, in the text Digital Processing of Signals by B. Gold and C. Roder, McGraw-Hill Book Co., 1969 which shows a digital first-order network in FIG. 2.4 (page 23). These networks require a multiplier to provide a gain factor K. Digital multipliers are very complex circuits and require relatively large areas on integrated circuit chips and so it is desirable to avoid their use whenever possible.

To that end, the digital filter of the present invention comprises an adder receiving input digital signals and producing filtered digital signals. A delaying device delays the filtered digital signals and applies them to a multiplexer or a shifter. The output of the multiplexer or shifter is coupled to the adder. A control device develops a control signal which is applied to the multiplexer or shifter thereby to control the gain of the digital filter.

Figure 2:
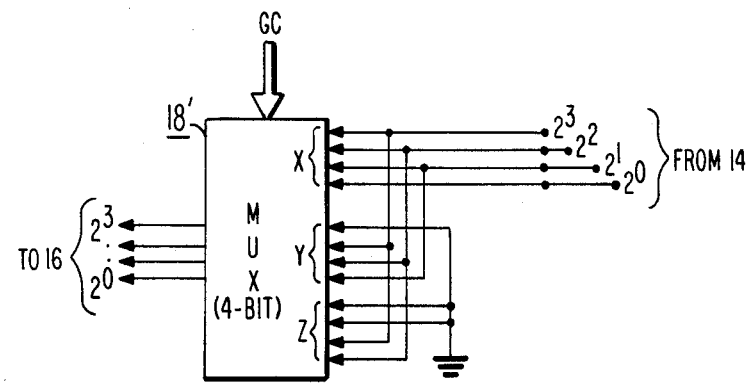
Figure 3:
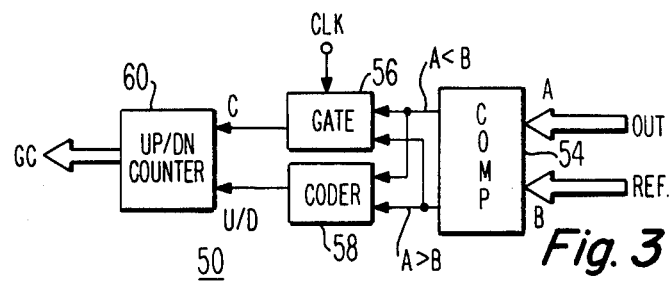

In The Drawing:

FIGS. 1, 2 and 3 are schematic diagrams, in block diagram form, including various aspects of embodiments of the present invention.

In the drawing, broad arrows represent digital signal paths for multiple bit parallel digital signals whereas line arrows represent single-bit digitals signals or digital level signals.

FIG. 1 shows a digital filter 10 having controllable gain which receives digital input signals IN and produces filtered digital output signals OUT. Signals IN and OUT are, for example, six to eight-bit digitized video samples in a television receiver having digital signal processing apparatus or can be twelve to sixteen-bit sound samples in a digital audio system.

Digital input signals IN are applied to a first input of digital adder 12, the output of which produces filtered digital output signals OUT. Signals OUT are applied to a delay device 14 which introduces a predetermined delay. It is preferred that delay 14 be a clocked delay such as a latch or a shift register and that it provide a delay of one period of a system clocking signal (not shown) with which the digital signals are synchronized.

The delayed filtered digital signals from delay 14 are applied to a first input (+) of digital combining device 16 and to the data input of controllable shifter 18. Controllable shifter 18 produces output digital signals which are shifted a predetermined number N of bit positions to the left (binary multiplication by $2^N$) or to the right (binary division by $2^N$ which is the same as binary multiplication by $2^{-N}$) in accordance with shifter gain control signal GC developed by gain control 50.

Digital combining circuit 16 receives the controllably shifted delayed filtered digital signals from shifter 18 at its second input (−) to produce the difference between the delayed filtered digital signals from delay device 14 and the shifted delayed filtered digital signals. The difference signal from combining circuit 16 is applied to the second input of digital adder 12 to be added to the digital input signals IN to produce the filtered output signals OUT. Combining circuit 16 can be, for example, a digital subtractor or a digital adder having a complementing circuit coupled to the input receiving signals from shifter 18 which are to be subtracted.

The operation of controllable gain digital filter 10 can be understood with the aid of the following equations. The ratio of the output to input signals (gain) is the lowpass filter transfer function given by $$\mathrm{OUT/IN} = 1/[1-(GZ^{-1})] \quad [1]$$

where: G is the gain factor provided by shifter 18 and combining circuit 16 in response to control signal GC, and $Z^{-1}$ represents the one clock cycle delay provided by delay device 14. For digital signals which vary at low frequencies relative to the clocking frequency, the transfer function reduces to $$\mathrm{OUT/IN} = 1/(1-G) \quad [2]$$

The gain G provided by shifter 18 and combining circuit 16 is given by $$G = 1 - (\tfrac{1}{2}^N) \quad [3]$$

where: N is the number of bits positions of rightward shifting (i.e. division) provided by shifter 18 in response to control signal GC. Substituting equation [3] into equation [9] gives $$\mathrm{OUT/IN} = 1/\{1-[1-(\tfrac{1}{2}^N)]\} = 2^N \quad [4]$$

showing that the gain of digital filter 10 is controllable responsive to the controllable shifting provided by shifter 18 in response to control signal GC.

Gain control 50 develops gain control signal GC to produce the required gain of digital filter 10. Preferably, control signal GC is developed at a rate much higher than that of the low frequency information included in input signal IN, for example, at the rate of the clocking signals. Thus, signal GC can change more rapidly than the low frequency information of digital signals IN and so can cause digital filter 10 to exhibit effective low frequency gains which are intermediate the discrete levels which would be realized if signal GC were not so changed. This effective gain is equal to the reciprocal of the average of the division factors $2^{-N}$ provided by shifter 18.

For example a gain of $2^4 = 16$ is provided by digital filter 10 when shifter 18 provides a four-position rightward shift, and a gain of $2^5 = 32$ is provided when shifter 18 provides a five-position rightward shift. Where control signal GC controls shifter 18 to provide alternating four- and five-position rightward shifts at the clocking rate at which digital input signals IN are received, an effective (i.e. "average") gain of approximately $1/\{(\tfrac{1}{2})[(1/32)+(1/16)]\} = 21.33$ is provided. Where the five-position shift is provided, for example, for one of every five digital input samples and four-position shifts are provided for the four intermediate samples thereof, the average gain provided is approximately $1/\{(1/5)[(1/32)+(1/16)+(1/16)+(1/16)+(1/16)]\} = 21.78$.

Therefore, a controllable gain is provided when shifter 18 is controlled by gain control signal GC developed by gain control 50 in a time varying fashion to, in effect, time multiplex the instantaneous gain exhibited by filter 10 to produce an average thereof with respect to the low frequency information contained in the input digital signals IN.

Specific exemplary embodiments of shifter 18 and control circuit 50 will now be described.

FIG. 2 shows a preferred arrangement for controllable shifter 18 which is simplified for ease of description to operate on a four-bit digital signal having bit position weights $2^3$, $2^2$, $2^1$, $2^0$. Four-bit multiplexer (MUX) 18' has three inputs X, Y, Z, for example, which are selectively coupled to its output in accordance with gain control signal GC so as to provide controllable shifting.

MUX 18' input X receives the four-bit digital signals with their bits in the orignal bit positions so that when control signal GC selects input X, the output signal from MUX 18' is, bit-for-bit, the input signal thereby providing division by unity. MUX 18' input Y receives the four-bit digital signals with their bits connected to be shifted one position lower in bit weight and receives a logical zero (ground level) in the highest weight bit position so that when control signal GC selects input Y, the output signal from MUX 18' is the input signal shifted one position to the right providing division by two (i.e. multiplication by $2^{-1}$). MUX input Z receives the four-bit digital signals with their bits connected to be shifted two positions lower in bit weight and receives logical zeros in the two highest weight bit positions so that when control signal GC selects input Z, the output signal from MUX 18' is the input signal shifted two positions to the right providing division by four (i.e. $2^2=4$; multiplication by $2^{-2}$). From this description, it is clear that various desired binary division factors can be realized by appropriate connections of the bits of the input digital signals and of logical zeros to the input bit lines of MUX 18'.

FIG. 3 shows an embodiment of gain control circuit 50 in which the level of the digital output signals OUT from controllable-gain lowpass digital filter 10 are controlled to be at a predetermined average reference level REF. Digital comparator 54 receives the output signals OUT at its input A and the reference level signal REF at its input B. Comparator 54 produces comparison signal A>B when the level of signal OUT exceeds that of signal REF and produces comparison signal A<B when the level of signal REF exceeds that of OUT.

Coder 58 responds to the A>B signal to apply a down-count control level to the up/down control input U/D of digital up/down counter 60 to enable it to count down. Gate 56 responds to the presence of the A>B signal to apply clocking signal CLK to the clocking input C of counter 60 causing it to decrement (count down). The outputs of the registers of counter 60 form a parallel digital word which is employed as the control signal GC. Decrementing counter 60 reduces the value indicated by control signal GC which decreases the number of rightward shifts (decreases the division) provided by shifter 18 to thereby decrease the gain exhibited by digital filter 10, whereby the level of output signal OUT will tend to be reduced and approach the level REF.

Conversely, coder 58 responds to the A<B comparison signal to enable up/down counter 60 to count up and gate 56 responds thereto to apply clocking signals CLK to counter 60 causing it to increment. Incrementing counter 60 increases the value of control signal GC to increase the shifting by shifter 18 and the gain exhibited by digital filter 10, whereby the level of output signal OUT tends to be increased and approach the level REF. It is noted that when OUT and REF are equal, comparator 54 produces neither of comparison signals A>B and A<B so that gate 56 does not apply clocking signal CLK to counter 60.

Modifications are contemplated to the present invention which is limited only by the claims following. For example, other types of shifters such as a clocked shift register can be used for shifter 18 providing similar response to control signal GC. Other gain control circuits 50 can also be used such as a flip-flop which receives set and reset inputs so as to change the value of its output, which is gain control signal GC, between two gain states. Alternatively, the flip-flop can be a D-type flip-flop to which a bit stream representing a time varying gain sequence is applied at its data "D" input.

The controlled gain lowpass filter described herein is useful in an FM ratio detector such as that described in U.S. Pat. No. 4,528,513 entitled "Digital FM Ratio Detector with Gain-Controlled Filter" filed by C. B. Dieterich on even date herewith and which is incorporated herein by reference.

What is claimed is:

1. A digital filter having a controlled gain for producing filtered digital signals from input digital signals comprising:

adding means having an output for producing the sum of digital signals applied to its first and second inputs, wherein said input digital signals are applied to said first input and said filtered digital signals are produced at said output;

delaying means, to which the output of said adding means is coupled, to delaying said digital sum signals;

multiplexing means for coupling a selected one of a plurality of inputs thereof to an output in accordance with a control signal, each of said plurality of inputs of said multiplexing means receiving said delayed digital sum signals modified by a respective gain factor;

means for coupling the output of said multiplexing means to the second input of said adding means for applying the one of said modified delayed digital signals selected by said multiplexing means; and control means for developing said control signal, and for applying said control signal to said multiplexing means, to select said one of said modified delayed digital signals thereby to control the gain of said digital filter, and wherein said control means comprises;

a source of a predetermined reference signal;

comparison means to which said predetermined reference signal and said filtered digital signals are applied for developing an indication of the relative levels thereof; and means responsive to said indication for developing said control signal.

2. The digital filter of claim 1 wherein said means responsive to said indication develops said control signal for controlling said multiplexing means to select an increasingly divided one of said modified delayed digital sum signals when said reference signal exceeds said filtered digital signals and to select a decreasingly divided one of said modified delayed digital sum signals when said filtered digital signals exceed said reference signal.

3. The digital filter of claim 1 wherein said multiplexing means comprises:

means for applying bits of said delayed digital sum signals to respective ones of said plurality of inputs of said multiplexing means with the most significant bits applied to successively lesser significant bit positions of successive ones of said plurality of inputs; and means for applying logically zero bits to the bit positions of said plurality of inputs of said multiplexing means not having bits of said delayed digital sum signals applied thereto.

4. The digital filter of claim 1 wherein said control means develops said control signal at a rate related to that of said input digital signals.

5. The digital filter of claim 1 wherein said control signal alternates periodically between first and second values corresponding to first and second gains of said digital filter so that said filtered digital signals are modified with respect to said input digital signals by an effective gain related to the relative times that said first and second values of said control signal are produced.

6. A digital filter having a controlled gain for producing filtered digital signals from input digital signals comprising:

adding means having an output for producing the sum of digital signals applied to its first and second inputs, wherein said input digital signals are applied to said first input and said filtered digital signals are produced at said output;

delaying means, to which the output of said adding means is coupled, for delaying said digital sum signals;

shifting means, to which said delaying means is coupled and responsive to a control signal, for controlled shifting of said delayed digital sum signals;

combining means, to which said delaying means and said shifting means are coupled, having an output for producing the difference of said delayed digital sum signals and said shifted delayed digital sum signals, the output of said combining means being coupled to the second input of said adding means for applying said difference digital signals; and control means responsive to delayed digital sum signals from said delaying means for developing said control signal, and for applying said control signal to said shifting means, to control the gain of said digital filter.

7. The digital filter of claim 6 wherein said control means comprises:

a source of a reference signal;

comparison means to which said reference signal and said filtered digital signals are applied for developing an indication of the relative levels thereof; and means responsive to said indication for developing said control signal.

8. The digital filter of claim 7 wherein said means responsive to said indication develops said control signal for controlling said shifting means to shift to increasingly divide said delayed digital sum signals when said reference signal exceeds said filtered digital signals and to shift to decreasingly divide said delayed digital sum signals when said filtered digital signals exceed said reference signal.

9. The digital filter of claim 6 wherein said shifting means comprises:

multiplexing means for coupling a selected one of a plurality of inputs thereof to an output thereof in accordance with said control signal;

means for applying bits of said delayed digital sum signals to respective ones of said plurality of inputs of said multiplexing means with the most significant bits applied to successively lesser significant bit positions of successive ones of said plurality of inputs; and means for applying logically zero bits to the bit positions of said plurality of inputs of said multiplexing means not having bits of said delayed digital sum signals applied thereto.

10. The digital filter of claim 6 wherein said control means develops said control signal at a rate related to that of said input digital signals.

11. The digital filter of claim 6 wherein said control signal alternates periodically between first and second values corresponding to first and second gains of said digital filter so that said filtered digital signals are modified with respect to said input digital signals by an effective gain related to the relative times that said first and second values of said control signal are produced.

12. A digital filter having a controlled gain for producing filtered digital signals from input digital signals comprising:

adding means having an output for producing the sum of digital signals applied to its first and second inputs, wherein said input digital signals are applied to said first input and said filtered digital signals are produced at said output;

delaying means, to which the output of said adding means is coupled, for delaying said digital sum signals;

multiplexing means for coupling a selected one of a plurality of inputs thereof to an output thereof in accordance with a control signal;

means for applying bits of said delayed digital sum signals to respective ones of said plurality of inputs of said multiplexing means with the most significant bits applied to successively lesser significant bit positions of successive ones of said plurality of inputs;

means for applying logically zero bits to the bit positions of said plurality of inputs of said multiplexing means not having bits of said delayed digital sum signals applied thereto;

combining means, to which said delaying means and said multiplexing means are coupled, having an output for producing the difference of said delayed digital sum signals and the digital signals produced at the output of said multiplexing means, the output of said combining means being coupled to the second input of said adding means for applying said difference digital signals;

a source of a reference signal;

comparison means to which said reference signal and said filtered digital signals are applied for developing an indication of the relative levels thereof; and means responsive to said indication for developing said control signal, and for applying said control signal to said multiplexing means, to control the gain of said digital filter.

13. The digital filter of claim 12 wherein said means responsive to said indication develops said control signal for controlling said shifting means to shift to increasingly divide said delayed digital sum signals when said reference signal exceeds said filtered digital signals and to shift to decreasingly divide said delayed digital sum signals when said filtered digital signals exceed said reference signal.

14. The digital filter of claim 12 wherein said control means develops said control signal at a rate related to that of said input digital signals.

15. The digital filter of claim 12 wherein said control signal alternates periodically beteen first and second values corresponding to first and second gains of said digital filter so that said filtered digital signals are modified with respect to said input digital signals by an effective gain related to the relative times that said first and second values of said control signal are produced.

* * * * *